(12) United States Patent
Faure et al.

(10) Patent No.: US 6,270,949 B1
(45) Date of Patent: Aug. 7, 2001

(54) SINGLE COMPONENT DEVELOPER FOR COPOLYMER RESISTS

(75) Inventors: Thomas B. Faure, Milton; Steven D. Flanders, Colchester; James P. Levin, South Burlington; Harold G. Linde, Richmond; Jeffrey F. Shepard, Starksboro, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/529,316

(22) PCT Filed: Aug. 11, 1999

(86) PCT No.: PCT/US99/18274

§ 371 Date: Apr. 11, 2000

§ 102(e) Date: Apr. 11, 2000

(87) PCT Pub. No.: WO00/10057

PCT Pub. Date: Feb. 24, 2000

Related U.S. Application Data

(60) Provisional application No. 60/096,015, filed on Aug. 11, 1998.

(51) Int. Cl.$^7$ .................................................... G03F 7/30
(52) U.S. Cl. ................................................................ 430/329
(58) Field of Search .............................................. 430/329

(56) References Cited

U.S. PATENT DOCUMENTS

| | | | |
|---|---|---|---|
| 3,953,265 | 4/1976 | Hood | 156/8 |
| 4,101,397 | 7/1978 | Kotzsch et al. | 204/158 HA |
| 4,435,575 | 3/1984 | Cainelli et al. | 546/341 |
| 4,454,200 | 6/1984 | Bellott, Jr. | 482/411.1 |
| 4,456,675 | 6/1984 | Anderson, Jr. et al. | 430/256 |
| 4,504,007 | 3/1985 | Anderson, Jr. et al. | 228/123 |
| 4,943,511 | 7/1990 | Lazarus et al. | 430/192 |
| 4,980,269 | 12/1990 | Sakurai et al. | 430/283 |
| 5,091,290 | 2/1992 | Rolfson | 430/327 |
| 5,354,645 | * 10/1994 | Schober et al. | 430/306 |
| 5,561,194 | 10/1996 | Cornett et al. | 525/143 |
| 5,688,628 | 11/1997 | Oie et al. | 530/176 |
| 5,733,706 | 3/1998 | Sezi et al. | 430/270.1 |

FOREIGN PATENT DOCUMENTS

| | | | |
|---|---|---|---|
| 0 506 593 B1 | 7/1998 | (EP) | G03F/7/004 |
| 55-140836A | 11/1980 | (JP) | G03C/5/00 |
| 60-002946A | 1/1985 | (JP) | G03C/1/72 |

OTHER PUBLICATIONS

Jpn. J. Appl. Phys. vol. 31 (1992) pp. 4508–4514, Part 1, No. 12B, Dec. 1992, Quantum Wire Fabrication by E–Beam Elithography Using High–Resolution and High–Sensitivity E–Beam Resist ZEP–520, Nishida et al.

Jpn. J. Appl. Phys. vol. 33 (1994) pp. 6919–6922, Part. 1, No. 12B, Dec. 1994, "Resist Performance in 5nm Soft X–Ray Projection Lithography", Oizumi et al.

Jpn. J. Appl. Phys. vol. 34 (1995) pp. 6940–6946, Part 1, No. 12B, Dec. 1995, "An Electron Beam Nanolithography System and its Application to Si Nanofabrication", Kurihara et al.

JPn. J. Appl. Phys. vol. 35 (1996) pp. 2385–2386, Part 1, No. 4A, Apr. 1996, "Sub–0.1um Patterning with High Aspect Ratio of 5 Achieved by Preventing Pattern Collapse", Yamashita.

Jpn. J. Appl. Phys. vol. 35 (1996) pp. 4133–4137, Part 1. No. 7, Jul. 1996, "Down to 0.1 um Pattern Replication in Synchrotron Radiation Lithography," Morigami et al.

J. Electrochem. Soc., vol. 144, No. 9, Sep. 1997, pp. 3169–3174, "Effect of Humidity on Photoresist Performance," Bruce et al.

J. Vac. Sci. Technol. B 12(6), Nov./Dec. 1994, pp. 3280–3827, "Characterization of an expanded–field Schwarzschild Objective for extreme ultraviolet lithography", Kubiak et al.

J. Vac. Sci. Technol. B 13(4), Jul./Aug. 1995, pp. 1473–1476, "Fabrication of sub–10–nm–silicon lines with minimum fluctuation," Namatsu et al.

J. Vac. Sci. Technol. B 14(6), Nov./Dec. 1996, pp. 3829–3833, "High resolution electron beam lithography using ZEP–520 and KRS resists t low voltage", Tanenbaum et al.

Microelectronic Engineering 27 (1995) pp. 71–74, "10–nm Silicon Lines Fabricated in (110) Silicon" Namatsu et al.

Microelectronic Engineering 27 (1995) pp. 317–320, Resist performance in 5nm and 13nm Soft X–ray Projection Lithography, Oizumi et al.

Microelectronic Engineering 30 (1996) pp. 419–422, "Nano–scale fluctuations in electron beam resist pattern evaluated by atomic force microscopy," Nagase et al.

http://www.cnf.cornell.edu/SPIE/spie7.ht,m SPIE Handbook of Microlithograhy, Micromachining and Microfabrication, vol. 1: Microlithography.

Proc. SPIE—Int. Soc. Opt. Eng. (USA) vol. 2437 1995, p. 209–21, Army Res. Lab., Electron & Power Sources Directorate, Fort Monmouth, NJ, USA, "High energy (100 keV)e– beam lithography applied for fabrication of deep submicron SAW devices on lithium niobate and quartz," Kondek et al.

Proceedings of the SPIE—The International Society for Optical Engineering, Proc. SPIE—Int. Soc. Opt. Eng. (USA) vol. 2512, p.21–7, "ZEP resist process for high accuracy photomask with a dry–etching capability", Tarumoto et al.

http://www.zeon.co.ip/english/new/f/f–tec4.html, "Future Challenges of Resist Materials for Mask Fabrication," Kawata.

(List continued on next page.)

Primary Examiner—Hoa Van Le
(74) Attorney, Agent, or Firm—Howard J. Walter, Jr.

(57) ABSTRACT

A method for developing copolymer photosensitive resists wherein a single solvent is used in conjunction with a puddle develop tool. The copolymer resist is ZEP 7000 and the developer is ethyl 3-ethoxy propionate (EEP).

6 Claims, No Drawings

OTHER PUBLICATIONS

Manufacture's Product Literature, Oct. 15, 1996, Nippon Zeon Co., LTD, "Positive Electron Beam Resist ZEP810S ZEP7000 ZEP7000B".

Chemical Data Sheets—Chemox Online, Benzyl Alchohol, Diethyl Ketone, Ethoxyethyl Acetate, Ethyl 3–ethoxypropionate, Hexyl Acetate, Octyl Acetate, Pentyl Acetate, Toluene, Xylene, P–Xylene.

* cited by examiner

SINGLE COMPONENT DEVELOPER FOR COPOLYMER RESISTS

This application is a 371 of PCT/US 99/18274 filed Aug. 11, 1999 which claims the benefit of Provisional Application No. 60/096,015 filed Aug. 11, 1998.

FIELD OF THE INVENTION

This invention relates to the making of photolithographic masks for semiconductor manufacturing and particularly to semiconductor technologies having minimum dimensions of 0.25 microns and less. More particularly, the invention relates to methods of spray or puddle developing copolymer photoresists.

BACKGROUND OF THE INVENTION

In the manufacture of semiconductor devices, the ever present need to continue increasing of the density of image segments continually causes the seeking of new and more efficient techniques for processing semiconductor devices. The manufacture of semiconductor masks is no exception and the move to sub-0.25 micron technologies is imminent.

The instant invention relates to chain scission co-polymer photoresists of the type formed of 1:1 copolymerization of a-chloromethacrylate and a-methylstyrene, available as ZEP-nnn resists and available from Nippon Zeon, Japan. These resists are sensitive to light and e-beam exposure which makes them particularly useful in mask manufacture. Various compositions of resist are available based on their molecular weight. For example ZEP-520, having a molecular weight of about 50,000, or ZEP-7000, having a molecular weight of about 333,000. Once exposed, radiation sensitive portions of the copolymer are rendered soluble in organic solvents to produce good relief images.

A typical application would be to apply the resist in a solvent to a substrate, bake to remove the solvent, expose the resist via e-beam and then develop using a commercially supplied developer comprising one of the following developers, mixtures of diethyl ketone and diethyl malonate and single component solvents such as tolulene, xylene and alkyl esters of acetic acid such as amyl acetate or hexyl acetate. Following development, coated substrates are rinsed in a solvent such as 2-propanol.

SUMMARY OF THE INVENTION

When previously practiced methods were attempted to be implemented in the manufacture of semiconductor masks of the sub-0.25 micron range, nonuniform characteristics of the resulting photomasks were observed. This was particularly true for the Critical Dimension (CD) variation across a mask blank.

The particular resist development process used was that of a puddle, spray or combination of the two as opposed to a dip or tank process associated with the copolymer resist as described in the literature.

It has been discovered that the evaporative characteristics of the developer environment varied across the surface of the substrate, leading to non-uniform development due to varying concentration of reagents in the developer solution.

It is an object of the instant invention to provide an more uniform environment for the development of copolymer resists in order to provide more uniform and reproducible results in the critical dimensions.

In accordance with the invention an active developer which comprises a substantially non-volatile single component solvent is used for developing copolymer resists on semiconductor mask blanks. The preferred developer is ethyl 3-ethoxy propionate (EEP).

These and other objects of the invention will become more apparent when viewed in light of the following more particular description of the preferred embodiment of the invention.

DESCRIPTION OF THE PREFERRED EMBODIMENT

A mask blank coated with 3,000 A of ZEP 7000, an e-beam photoresist comprising a 1:1 copolymer of a-chloromethacrylate and a-methylstyrene, was exposed using an e-beam tool (accelerating voltage of 10–75 keV) at a dose ranging from 8–70 $\mu$C/cm2. The exposure dose used for this resist depends on the accelerating voltage of the e-beam tool. For 10 keV, the dose is 8–12 $\mu$C/cm2. For 75 keV, the dose is 60–70 $\mu$C/cm2. After e-beam exposure, the ZEP resist on the mask blank is developed in a single substrate spin tool using a solvent develop chemistry. The develop process was performed using either a puddle process, a spray process, or a combination puddle/spray process. The preferred tool for implementing the development process is a multiple puddle process in which developer is dispensed to cover the mask blank in sufficient quantity to allow puddle etching, see U.S. Pat. No. 3,953,265 to Hood issued Apr. 27, 1976.

During the develop process, a solvent develop chemistry is dispensed on the mask either via a spray or stream and is followed by a solvent rinse and high speed spin dry.

The ZEP resist manufacturer (Nippon Zen Inc.) recommended solvent develop chemistry for ZEP, consisting of a mixture of diethyl ketone and diethyl malonate, be used. Nippon Zen sells this developer pre-mixed under the Trade name ZED 500. The use of the ZED 500 developer resulted in a Critical Dimension (CD) non-uniformity across the mask of 42 nm (3 sigma). This is an unacceptable result for fabrication of advanced photomasks. CD uniformity of 30 nm (3 sigma) or smaller is required for photomasks to be used in fabricating mask for technologies having 0.25 um and smaller device geometries. The 42 nm CD non-uniformity had a very consistent radial error characteristic seen across the 130 mm×130 mm quality area of the plate. The images at the outer edges of the plate were consistently smaller than the images in the center of the plate.

Experiments were performed to try to understand the main source of the high CD non-uniformity, which led to the following previously unrecognized results and conclusions: The temperature of the actual developer puddle was measured on the mask blank, and it was found that the puddle was 2 degrees Centigrade (C) cooler at the edges of the plate compared to the center of the plate. This 2 degree difference was found to be due to evaporative cooling of the developer that was occurring at the edges of puddle near the edge of the plate. Other work showed that the active developer component in the ZED 500 was the diethyl ketone which is quite volatile and has a low boiling point (102 C). It was hypothesized that the highly volatile diethyl ketone component was evaporating at the edge of the plate (causing the 2 C center to edge temperature gradient). The lower developer temperature combined with the decreased concentration of the active developer component at the edge of the plate caused a slower develop rate on images at the edge of the plate and consequently a smaller image size at the edge of the plate compared to images at the center of them plate.

Based on this information, a new single component higher boiling point and lower volatility develop chemistry was proposed. After evaluating a number of organic solvents, a puddle develop process using ethyl 3-ethoxy propionate (EEP) (CAS Registry Number 763-69-9) was defined that resulted in CD uniformity of 9 nm (3 sigma) across the plate. EEP has a boiling point of 166 C.

Many ZEP-coated plates have since been processed with this new EEP develop chemistry with CD uniformities consistently being achieved in the 8–15 nm range. In addition to giving significantly improved CD uniformity performance, the EEP developer causes less thinning of the unexposed ZEP 7000 resist which consequently results in a higher contrast process compared to the ZED 500 develop chemistry.

Based on the success of the single component developer of the invention, it can be said that any two component solvent develop system in which one component is more volatile than the other will suffer evaporative cooling and concentration changes due to this difference, resulting in CD non-uniformity issues of the same or similar magnitude as observed by the inventors.

Accordingly, by selecting a single evaporative component having a substantially high boiling point, one can ensure that the develop environment is controlled sufficiently to provide good CD control across a mask blank.

Additional single solvent developers were evaluated and, although each met some of the preferred characteristics exhibited by EEP, each had other drawbacks which rendered them unacceptable for use in a manufacturing environment.

For example, cellosolve acetate proved to provide acceptable physical results but because it is a teretogen, is believed to be unsafe for routine use in manufacturing.

Carbitol proved to be unacceptable due to its tendency to cause swelling, and thus distort the images, in the undeveloped patterns. Butyl carbitol proved to be unacceptable since it failed to develop exposed resist at all.

Methyl 3-methoxypropionate, a lower alkyl of EEP, proved to be unsuitable as it removed unexposed resist at a high rate.

The specific optimum developer for higher molecular weight copolymer resists might be other single solvent materials which will remain stable in the developing environment proposed.

While the invention has been described in terms of a specific embodiment, it will be understood by those skilled in the photolithographic art that other single components of low volatility can be used to develop other copolymer resist systems.

What is claimed is:

1. The method of processing a copolymer photosensitive resist on the surface of a substrate including the steps of:

exposing portions of said copolymer resist to an image pattern which renders exposed portions soluble in organic solvents; and developing said exposed portions of said resist by rotating said substrate and providing an atmosphere consisting substantially of a single component solvent having a boiling point in excess of 102 degrees Centigrade.

2. The method of claim 1 wherein the copolymer photosensitive resist is a copolymer of a-chloromethacrylate and a-methylstyrene.

3. The method of claim 2 wherein the single solvent is ethyl 3-ethoxy propionate.

4. The method of claim 1 wherein the copolymer resist is formed on the surface of a photolithographic mask blank.

5. The method of claim 4 wherein the step of developing is carried out in a puddle etch environment.

6. The method of claim 2 wherein the molecular weight of the copolymer is in excess of about 100,000.

* * * * *